United States Patent
Yokoo

(10) Patent No.: US 7,737,758 B2
(45) Date of Patent: Jun. 15, 2010

(54) LEVEL SHIFT CIRCUIT

(75) Inventor: Satoshi Yokoo, Ota (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/341,665

(22) Filed: Dec. 22, 2008

(65) Prior Publication Data

US 2009/0160525 A1    Jun. 25, 2009

(30) Foreign Application Priority Data

Dec. 25, 2007    (JP) .............................. 2007-332998

(51) Int. Cl.
*H03L 5/00*    (2006.01)
(52) U.S. Cl. ............................ 327/333; 326/81; 326/63
(58) Field of Classification Search ............. 326/62–63, 326/80–81; 327/306, 333
See application file for complete search history.

(56) References Cited

U.S. PATENT DOCUMENTS 7,026,855 B2 *    4/2006    Sueoka et al. ............... 327/333
7,285,992 B1 *    10/2007    Maida ........................ 327/112
7,365,571 B2 *    4/2008    Seo et al. ..................... 326/83

FOREIGN PATENT DOCUMENTS

JP    7-23277    1/1995
JP    2000-244306    9/2000

OTHER PUBLICATIONS esp@cenet patent abstracts for Japanese Publication No. 2000244306, Publication date Sep. 8, 2000 (1 page).
esp@cenet patent abstract for Japanese Publication No. 7023277, Publication date Jan. 24, 1995 (1 page).

* cited by examiner

*Primary Examiner*—Dinh T. Le
(74) *Attorney, Agent, or Firm*—Osha • Liang LLP

(57) ABSTRACT

An amplifier including the transistors of a first set operates by a power source VCC2, and amplifies the input signal, changing in the voltage range of the power source VCC2, in the voltage range of the power source VCC2. The output of this amplifier operates using a power source VCC1 with a converting portion including the transistors of a second set, and the output of the amplifier is converted into an output within the voltage range of the power source VCC1. The two output amplifiers amplify the output of this converting portion based on a (½) VCC1 reference. The converting portion performs the conversion using a plurality of transistors with the power source VCC2 taken as a power source and a plurality of transistors 7 with the power source VCC1 taken as a power source, as current mirrors.

4 Claims, 1 Drawing Sheet

LEVEL SHIFT CIRCUIT

CROSS-REFERENCE TO RELATED APPLICATION

The disclosure of Japanese Patent Application No. 2007-332998 filed on Dec. 25, 2007 including specification, claims, drawings, and abstract is incorporated herein by reference in its entirety.

BACKGROUND OF THE INVENTION

1. Field of the Invention

The present invention relates to a level shift circuit for shifting the voltage level of a current signal.

2. Description of the Related Art

In imaging equipment such as a video camera and a digital still camera, there is a requirement for preventing a video image from becoming degraded due to the occurrence of blur in a subject image by vibration and the like, such as by hand shake, and a vibration measurement mechanism is provided. This vibration measurement mechanism detects the vibration of the imaging equipment with respect to the subject, and it is known that, in response to vibration, an optical system (lens) and the like is shift-corrected by a motor and the like (see Japanese Patent Laid-Open Publication No. Hei 07-23277 etc.).

As this motor for correction, a voice coil motor and the like are used, and to make the driving of this voice coil effective, a power source of preferably high voltage is used.

Hence, after performing the amplification of the signal for driving with an internal reference voltage, the power source voltage is level-shifted to a battery power source, and as a result the circuit and the like for outputting the signal to the voice coil is adopted as a drive circuit of the voice coil.

Further, as related literature, Japanese Patent Laid-Open Publication No. 2000-244306 can be cited.

Here, the battery power source is lowered with use. Depending on the kind of the battery, there are cases where the lowering of the voltage is considerably large. In this case, when the reference voltage internally used is made undependable on the battery power source and unalterable, the reference voltage and the battery power source are sometimes reversed.

In general, the level-shift circuit is configured such that the relation of magnitude between two power sources that are the object of conversion is fixed, and the relation is not assumed to be reversed. Hence, when the relation of two power source voltages is reversed, there is a problem that the circuit is unable to perform an expected operation.

SUMMARY OF THE INVENTION

According to the present invention, since the conversion of the power source voltages is performed by a current mirror, the level shift of the signal can be performed regardless of the magnitude of both of the power source voltages.

DESCRIPTION OF PREFERRED EMBODIMENTS

Figure 1:
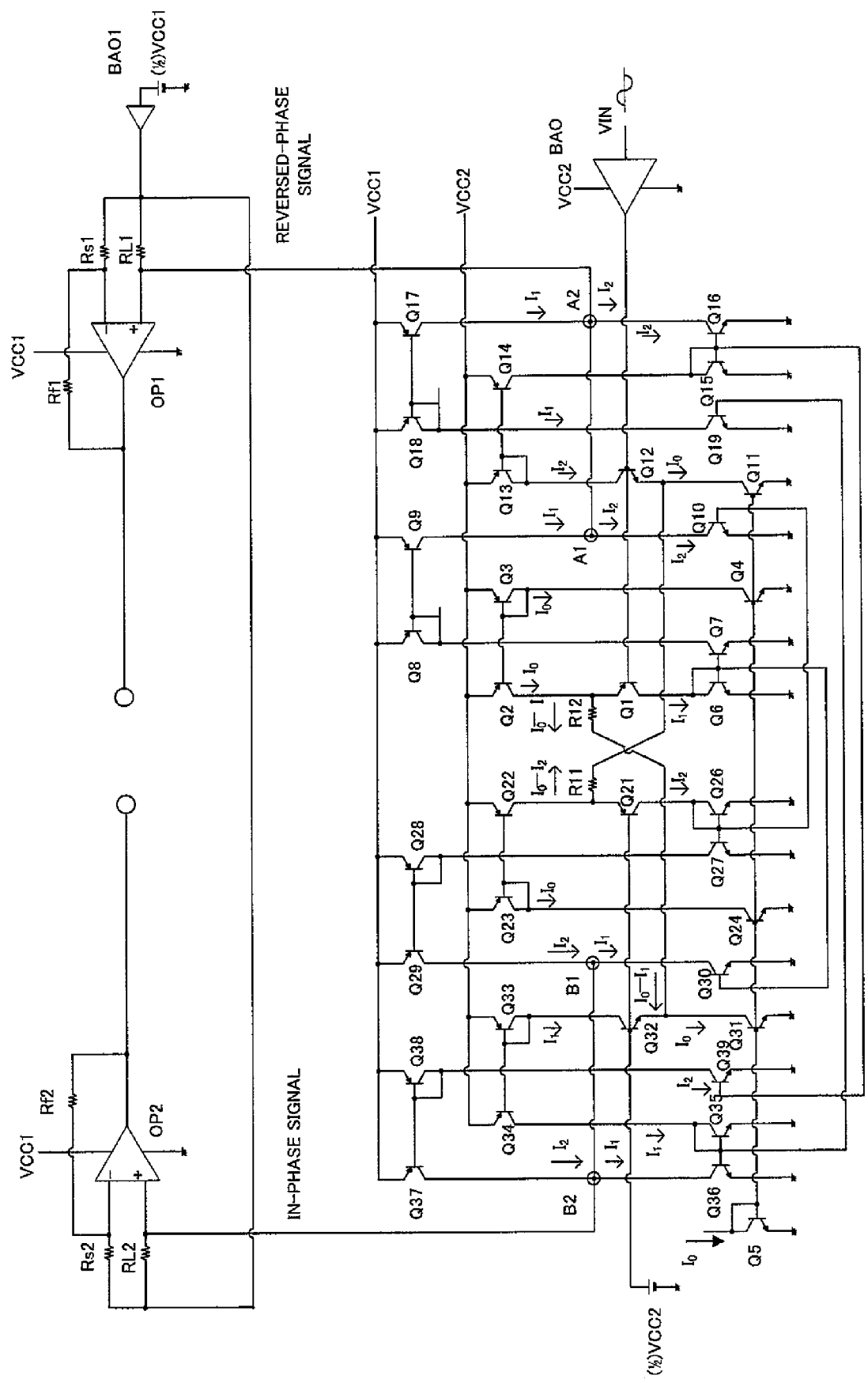
FIG. 1 is a view showing the configuration of a level-shift circuit of the embodiment.

An embodiment of the present invention will be described below with reference to the drawing.

FIG. 1 shows a circuit according to the embodiment. An input signal Vin is inputted to the base of a PNP transistor Q1 via a buffer amplifier BAO. The emitter of this transistor Q1 is connected with the collector of a PNP transistor Q2, and the emitter of this transistor Q2 is connected to a power source VCC2. The base of the transistor Q2 similarly has the emitter connected with the power source VCC2 and connected with the base of a transistor Q3, whose collector and base are short-circuited. The collector of this transistor Q3 is connected to the collector of an NPN transistor Q4. The transistor Q4 has the emitter connected to ground, and has the base connected to the base of a transistor Q5 at the current mirror input side, whose collector and base are short-circuited.

This current mirror input side transistor Q5 causes a fixed current I0 to flow, and all transistors constituting this transistor Q5 and the current mirror cause this fixed current I0 to flow. Consequently, all the transistors Q4, Q3, and Q2 cause the current I0 to flow.

The collector of the transistor Q1 is connected with the collector of an NPN transistor Q6, and this transistor Q6 has the collector and base short-circuited and has the emitter connected to ground. The base of the transistor Q6 is connected with an NPN transistor Q7, whose emitter is connected to ground, and the collector of this transistor Q7 is connected to the collector of a PNP transistor Q8. The transistor Q8 has the emitter connected to a power source VCC1, and has the base and collector short-circuited. Consequently, the transistor Q8 causes the same current as that of the transistor Q7 to flow. The base of the transistor Q8 is connected with a PNP transistor Q9, whose emitter is connected to the power source VCC1, and the transistors Q8 and Q9 constitute the current mirror. The collector of the transistor Q9 is connected with the collector of an NPN transistor Q10, and the emitter of this transistor Q10 is connected to ground.

Consequently, the transistor Q9 causes the current (I1) flowing through the transistor Q1 to flow. The difference between the current flowing through the transistor Q9 and the current flowing through the transistor Q10 is obtained at a node A1 which is a connection point of the collector of the transistor Q9 and the collector of the transistor Q10, and this is outputted.

On the other hand, the signal of a fixed value of (½) VCC2 is inputted to the base of a PNP transistor Q21. The emitter of this transistor Q21 is connected with the collector of a PNP transistor Q22, and the emitter of this transistor Q22 is connected to the power source VCC2. The base of the transistor Q2 similarly has the emitter connected with the power source VCC2, and is connected with the base of a transistor Q23, whose collector and base are short-circuited. The collector of this transistor Q23 is connected to the collector of an NPN transistor Q24. The transistor Q24 has the emitter connected to ground, and has the base connected to the base of the current mirror input side transistor Q5, whose collector and base are short-circuited.

This current mirror input side transistor Q5 causes the fixed current I0 to flow, and all transistors constituting this transistor Q5 and the current mirror cause this fixed current I0 to flow. Consequently, all of the transistors Q24, Q23, and Q22 cause the current I0 to flow.

The collector of the transistor Q21 is connected with the collector of an NPN transistor Q26, and this transistor Q26 has the collector and base short-circuited, and has the emitter connected to ground. The base of the transistor Q26 is connected with an NPN transistor Q27, whose emitter is connected to ground, and the collector of this transistor Q27 is connected to the collector of a PNP transistor Q28. The transistor Q28 has the emitter connected to a power source VCC1, and has the base and collector short-circuited. Consequently, the transistor Q28 causes the same current as that of the transistor Q27 to flow. The base of the transistor Q28 is connected with a PNP transistor Q29, whose emitter is connected to the power source VCC1, and the transistors Q28 and Q29 constitute the current mirror. The collector of the transistor Q29 is connected with the collector of an NPN transistor Q30, and the emitter of this transistor Q30 is connected to ground.

Consequently, the current (I2) flowing through the transistor Q21 flows into transistor Q29. The difference between the current flowing through the transistor Q29 and the current flowing through the transistor Q30 is obtained at a node B1 which is a connection point of the collector of the transistor Q29 and the collector of the transistor Q30, and this is outputted.

Here, the base of the transistor Q10 is connected to the base of the transistor Q26. Consequently, these transistors Q26 and Q10 constitute the current mirror, and the transistor Q10 causes the same current as that of the transistor Q26 to flow. Since the transistor Q26 causes the current I2 flowing through the transistor Q21 to flow, the current flowing through the node A1 becomes the current I1-I2. Further, the base of the transistor Q30 is connected to the base of the transistor Q6. Consequently, these transistors Q6 and Q30 constitute the current mirror, and the transistor Q30 causes the same current as that of the transistor Q6 to flow. Since the transistor Q6 causes the current I1 flowing through the transistor Q1 to flow as it is, the current flowing through the node B1 becomes the current I2-I1.

The connection point of the emitter of the transistor Q21 and the collector of the transistor Q22 is connected with one end of a resistor R11, and the other end of this resistor R11 is connected to the collector of an NPN transistor Q11. This transistor Q11 has the emitter connected to ground and the base connected to the base of the transistor Q5, and causes the current I0 to flow.

The collector of the transistor Q11 is connected with the emitter of an NPN transistor Q12 and the other end of the resistor R11, and the base of this transistor Q12 is connected with an output of a buffer amplifier BA0, and here, the input signal Vin is inputted. The collector of the transistor Q12 is connected with the collector of a PNP transistor Q13. The emitter of the transistor Q13 is connected to the power source VCC2, and the base and collector are short-circuited. The base of the transistor Q13 is connected with the base of a PNP transistor Q14, whose emitter is connected to the power source VCC2, and the transistors Q13 and Q14 constitute the current mirror. The collector of the transistor Q14 is connected to the collector of an NPN transistor Q15. The transistor Q15 has the emitter connected to ground, and has the base and collector short-circuited, and causes the same current as that of the transistor Q14 to flow. The base of the transistor Q15 is connected with the base of an NPN transistor Q16, whose emitter is connected to ground. The transistors Q15 and Q16 constitute the current mirror.

The collector of the transistor Q16 is connected with the collector of a PNP transistor Q17, and here it becomes a node A2. The transistor Q17 has the emitter connected with the power source VCC1 and the base connected with a PNP transistor Q18. The transistor Q18 has the emitter connected with the power source VCC1 and has the base and collector short-circuited. Consequently, the transistors Q18 and Q17 constitute the current mirror, and the transistor Q17 causes the same current as that of the transistor Q18 to flow. The collector of the transistor Q18 is connected with the collector of an NPN transistor Q19, whose emitter is connected to ground.

The connection point of the emitter of the transistor Q1 and the collector of the transistor Q2 is connected with one end of a resistor R12, and the other end of this resistor R12 is connected to the collector of an NPN transistor Q31. This transistor Q31 has the emitter connected to ground and the base connected to the base of the transistor Q5, and causes the current I0 to flow.

The collector of the transistor Q31 is connected with the emitter of an NPN transistor Q32 and the other end of the resistor R12, and the base of this transistor Q32 is connected with the power source (½) VCC2. The collector of the transistor Q32 is connected with the collector of a PNP transistor Q33. The emitter of the transistor Q33 is connected to the power source VCC2, and has the base and collector short-circuited. The base of the transistor Q33 is connected with the base of a PNP transistor Q34, whose emitter is connected to the power source VCC2, and the transistors Q33 and Q34 constitute the current mirror. The collector of the transistor Q34 is connected with the collector of the NPN transistor Q35. The transistor Q35 has the emitter connected to the ground, and has the base and collector short-circuited, and causes the same current as that of the transistor Q34 to flow. The base of the transistor Q35 is connected with the base of an NPN transistor Q36, whose emitter is connected to ground. The transistors Q35 and Q36 constitute the current mirror.

The collector of the transistor Q36 is connected with the collector of a PNP transistor Q37, and here it becomes a node B2. The transistor Q37 has the emitter connected with the power source VCC1 and the base connected with a PNP transistor Q38. The transistor Q38 has the emitter connected with the power source VCC1 and has the base and collector short-circuited. Consequently, the transistors Q38 and Q37 constitute the current mirror, and the transistor Q37 causes the same current as that of the transistor Q38 to flow. The collector of the transistor Q38 is connected with the collector of an NPN transistor Q39, whose emitter is connected to ground.

Here, the base of the transistor Q39 is connected with the base of the transistor Q15, and the transistors Q15 and Q39 constitute the current mirror. Further, the base of the transistor Q19 is connected with the base of the transistor Q35, and the transistors Q35 and Q19 constitute the current mirror.

The transistor Q15 causes a current identical to that in the transistor Q12 to flow, and on the other hand, the transistor Q35 causes the same current as that of the transistor Q32 to flow. Here, the emitter of the transistor Q12 is connected with the other end of the resistor R11. A current that is derived by adding up the current flowing through the transistor Q12 and the current flowing from the resistor R11 flows into the transistor Q11, and this current flowing into the transistor Q11 is the same as the current I0 flowing through the transistor Q5. One end of the resistor R11 is connected to the collector of the transistor Q22, and this transistor Q22 causes the current I0 to flow, similarly to the transistors Q24 and Q23. Since the current I2 flows through the transistor Q21, the current (I0-I2) flows through the resistor R11. Consequently, the current I2, which derived by subtracting the current I0-I2 flowing in the resistor R11 from the current I0 flowing through the transistor Q11, is assumed to flow through the transistor Q12. If the current I2 flows through this transistor Q12, the current I2 also flows through the transistor Q15, and the current I2 also flows through the transistor Q39. Consequently, the current I2 flows through the transistor Q37.

The transistor Q35 causes current identical to that of the transistor Q32 to flow. On the other hand, the transistor Q35 causes the same current as that in the transistor Q32 to flow. Here, the emitter of the transistor Q32 is connected with the other end of the resistor R12. A current derived by adding up the current flowing into the transistor Q32 and the current flowing from the resistor R12 flows into the transistor Q31, and the current flowing into the transistor Q31 is the same as the current I0 flowing through the transistor Q5. One end of the resistor R12 is connected to the collector of the transistor Q2, and this transistor Q2 causes the current I0 to flow, similarly to the transistors Q24 and Q23. Since the current I1 flows into the transistor Q1, the current (I0-I1) flows into the resistor R12. Consequently, the current I1, which is derived by subtracting the current I0-I1 flowing in the resistor R12 from the current I0 flowing through the transistor Q31, is assumed to flow through the transistor Q32. If the current I1 flows through this transistor Q32, the current I1 also flows through the transistor Q35, and the current I1 also flows through the transistor Q19. Consequently, the current I1 flows through the transistor Q17. The resistance values of the resistors R11 and R12 are usually set as R11=R12=R.

In this manner, the transistors Q1 and Q32 cause the current I1 to flow, and the transistors Q21 and Q12 cause the current I2 to flow. The input signal Vin is fed to the bases of the PNP transistor Q1 and the NPN transistor Q12, and (½) VCC2 is fed to the bases of the PNP transistor Q21 and the NPN transistor Q32. Consequently, the voltage applied to both ends of the resistor R11 is {(½) VCC2+1VBE}−(Vin−1VBE)={(½) VCC2−Vin}+2VBE, and the voltage applied to both ends of the resistor R12 is {Vin+1VBE}−((½)VCC2−1VBE)={Vin−(½)VCC2}2VBE. With these voltages, the currents (I0-I2) and (I0-I1) flowing through the resistors R11 and R12 are decided, and eventually, the current I1 flows through the transistors Q1, Q9, Q17, Q30, and Q36, the current (½)VCC2 flows through the transistors Q21, Q29, Q37, Q10, and Q16, the current (I1-I2) flows through the nodes A1 and A2, and the current (I2-I1) flows through the nodes B1 and B2. That is, the transistors Q1 and Q21 operate as a differential transistor, and the voltage inputted to the transistor Q21 is the fixed voltage (½) VCC2, the nodes A1 and A2 obtain the input signal Vin and the signal of an reverse polarity (reversed-phase signal), and the nodes B1 and B2 obtain a signal (in-phase signal) of the same polarity as the input signal.

Further, the node A1 and the node A2 are connected, and after the signals thereof are added, they are inputted to the positive input end of an operational amplifier OP1. This positive input end of the operational amplifier OP1 is connected to the power source (½) VCC1 via a resistor RL1 and a buffer amplifier BA01. Further, the negative input end of the operational amplifier OP1 is connected with the power source (½) VCC1 via a resistor Rs1, and the output end of the operational amplifier OP1 is connected via a resistor Rf1. Further, the operational amplifier OP1 is provided with the power source VCC1 as an operational power source. Consequently, the reversed-phase signal is amplified by this operational amplifier OP1, and outputted with VCC1 as the power source.

Further, the node B1 and the node B2 are connected, and after the signals thereof are added, they are inputted to the positive input end of an operational amplifier OP2. This positive input end of the operation amplifier OP2 is connected to the power source (½) VCC1 via a resistor RL2. Further, the negative input end of the operational amplifier OP2 is connected with the power source (½) VCC1 via the buffer amplifier BA01 and a resistor Rs2, and the output end of the operational amplifier OP1 is connected via a resistor Rf2. Further, the operational amplifier OP2 is fed with the power source VCC1 as an operational power source. Consequently, the in-phase signal is amplified by this operational amplifier OP2, and outputted with VCC1 as a power source.

Here, assuming that the resistance value of each resistor is RL1=RL2=RL, Rs1=Rs2=Rs, Rf1=Rf2=Rf, the gain of the level shift from VCC2 to VCC1 becomes (4×RL)÷R, and the gain as a BTL amplifier outputted from the operational amplifiers OP1 and OP2 becomes 2×(1+Rf/Rs).

That is, the level shift from the input signal Vin with (½) VCC2 as a center to the output signal with (½) VCC1 as a center becomes a ratio of R which is the resistance value of the resistors R11 and R12 disposed between an input route of the input signal Vin and an input route of the reference signal, and a load resistance RL1=RL2=RL disposed with (½) VCC1 in the output side, and since this ratio exists at four places in total, they are added to become (4×RL)÷R. On the other hand, gain of each of the operational amplifiers OP1 and OP2 becomes 1+Rf/Rs with the resistance value of the input resistor as Rs and the resistance value of feedback resistor as Rf, and becomes 2×(1+Rf/Rs) by adding the gains of the in-phase side and the reversed phase side.

In this manner, in the present embodiment, the power source of a differential amplifier inputted with the input signal Vin is taken as VCC2, and the output thereof is converted into a power source VCC1 reference by the current mirror. Consequently, there is no problem regardless of whether the power source VCC1 or the power source VCC2 is high voltage. In general, as the circuit for generating a control signal, a reference power source (generated by a fixed voltage circuit and the like from a battery power source) VCC2 of a relatively low voltage and having small variation is used, whereas the output of the amplifier is a voltage for driving a coil, and uses the battery power source VCC1 as it is preferable to use high voltage. However, when the battery power source fluctuates or the battery is consumed, the voltage is sometimes lowered considerably. In that case, it is also conceivable that the power source VCC1 will become lower than the power source VCC2. In the present embodiment, even in such a case also, no problem occurs in the operation itself.

Further, since the present embodiment is of the type in which two outputs are generated in one phase and are added, the output signal becomes double.

In the above description, while it is described that all the current mirrors have the same emitter area, and cause the same current to flow, the emitter area may be appropriately changed and a mirror ratio may be changed. Further, while the input signal to the transistor Q21 is taken as a fixed voltage, it may be taken as a reversed signal of the input signal Vin.

What is claimed is:

1. A level shift amplifier circuit for amplifying and level-shifting an input signal, comprising:
    an input side amplifier configured to amplify the input signal to generate an amplified input signal; and
    a converting circuit configured to convert the amplified input signal to a pair of converted output signals;
    wherein the input side amplifier is configured to operate from a second power source voltage,
    wherein the converting circuit comprises a current mirror circuit that comprises an input side transistor configured to operate from the second power source voltage and an output side transistor configured to operate from a first power source voltage,
    wherein a voltage range of the input signal and the amplified input signal are within a voltage range of the second power source voltage, and wherein a voltage range of the converted output signals is within a voltage range of the first power source voltage.

2. The level shift amplifier circuit according to claim 1, further comprising: an output side amplifier for amplifying the pair of converted output signals by a voltage reference of half the first power source voltage.

3. A level shift circuit, comprising:

a first transistor of a p type receiving an input signal at a control terminal and configured such that a current I1 corresponding to a control signal flows;

a first fixed current circuit configured such that a fixed current I0 flows from a second power source toward the first transistor;

a second transistor of a p type receiving a reference signal at the control terminal and configured such that a current I2 corresponding to the reference signal flows;

a second fixed current circuit configured such that the fixed current I0 flows from the second power source toward the second transistor;

a third transistor of an n type receiving an input signal at the control terminal and configured such that the current flows from the second power source;

a third fixed current circuit configured such that a fixed current I0 flows from the third transistor to ground;

a fourth transistor of an n type receiving the reference signal at the control terminal and configured such that the current to flow from the second power source;

a fourth fixed current circuit configured such that fixed current I0 flows from the fourth transistor toward ground;

a first resistor, having one end connected to an upstream side of the first transistor and the other end connected to a downstream side of the fourth transistor such that current I0-I1 flows; and a second resistor, having one end connected to an upstream side of the second transistor and the other end connected to a downstream side of the third transistor, such that current I0-I2 flows;

wherein the currents flowing through the first transistor and the third transistor are respectively converted into current with a first power source as a reference by using a current mirror, and by adding these currents, a difference signal thereof is obtained, and wherein the currents flowing through the second transistor and the fourth transistor are respectively converted into current with the first power source as a reference by using a current mirror, and by adding these currents, a difference signal thereof is obtained, and wherein the two difference signals thus obtained are outputted as in-phase and reverse-phase signals.

4. The shift level circuit according to claim 3, further comprising two amplifiers for respectively amplifying the two difference signals with the first power source as a reference, and wherein a pair of complementary signals are outputted from these two amplifiers.

* * * * *